(12) United States Patent
Hsiao (10) Patent No.: US 8,617,967 B2
(45) Date of Patent: Dec. 31, 2013

(54) VERTICALLY ORIENTED NANOSTRUCTURE AND FABRICATING METHOD THEREOF

(75) Inventor: Hsi-Lien Hsiao, Taichung (TW)

(73) Assignee: Tunghai University, Taichung (TW)

(*) Notice: Subject to any disclaimer, the term of this patent is extended or adjusted under 35 U.S.C. 154(b) by 323 days.

(21) Appl. No.: 12/938,387

(22) Filed: Nov. 3, 2010

(65) Prior Publication Data

US 2011/0155995 A1    Jun. 30, 2011

(30) Foreign Application Priority Data

Dec. 30, 2009  (TW) ................................ 98145912 A (51) Int. Cl.
*H01L 21/20* (2006.01)

(52) U.S. Cl.
USPC ...... 438/478; 257/741; 257/E21.09; 438/795; 438/962; 977/762

(58) Field of Classification Search
USPC ............................ 257/734, 741; 438/478, 479
See application file for complete search history.

(56) References Cited

U.S. PATENT DOCUMENTS

| 6,399,177 | B1* | 6/2002 | Fonash et al. ................ 428/119 |
| 7,488,455 | B2* | 2/2009 | Dai et al. ...................... 422/150 |
| 7,926,440 | B1* | 4/2011 | Tombler et al. ............... 118/59 |
| 2005/0224360 | A1* | 10/2005 | Varghese et al. ............ 205/171 |
| 2008/0176030 | A1* | 7/2008 | Fonash et al. ................ 428/119 |
| 2009/0061217 | A1* | 3/2009 | Silva et al. ................... 428/336 |

* cited by examiner

*Primary Examiner* — John C Ingham
(74) *Attorney, Agent, or Firm* — CKC & Partners Co., Ltd.

(57) ABSTRACT

A vertically oriented nanometer-wires structure is disclosed. The vertically oriented nanometer-wires structure includes a non-crystalline base and many straight nanometer-wires. The straight nanometer-wires are uniformly distributed on the non-crystalline base, and the angle between each of the straight nanometer-wire and the non-crystalline base is 80-90 degrees. The straight nanometer-wires structure can be widely applied in semiconductor, optoelectronic, biological and energy field. What is worth to be noticed is that the non-crystalline base can be glass, ceramics, synthetic, resin, rubber or even metal foil, and the straight nanometer-wires and the non-crystalline base are still orthogonal to each other.

18 Claims, 11 Drawing Sheets

VERTICALLY ORIENTED NANOSTRUCTURE AND FABRICATING METHOD THEREOF

RELATED APPLICATIONS

This application claims priority to Taiwan Patent Application Number 98145912, filed Dec. 30, 2009, which is herein incorporated by reference.

BACKGROUND

1. Technical Field

The present disclosure relates to a semiconductor fabricating method, and more particularly to a semiconductor nanometer-wires structure fabricating method.

2. Description of Related Art

In recent years, silicon nanostructures have received great deal of attention for their unique physical and chemical effects. The use of silicon nanostructures have been applied to a wide variety of fields including semiconductor, optoelectronic, biological and energy field. Therefore, developing silicon nanostructure fabrication technique becomes an intriguing topic for researchers.

When growing the nanostructure on a crystalline base, the angle between the nanometer-wires and the crystalline base could be controlled within 80-90 degrees. However, the crystalline base is much more expensive than the non-crystalline base. The non-crystalline base is widely applied in many technologies, such as the thin film solar cell or liquid crystal display (LCD), for its cheaper price and large area production capability. What is worth to be noticed is that when growing the nanostructure on a non-crystalline base, the directions of the nanometer-wires are random. In other words, the nanostructure made by using the non-crystalline base is cheap but performs poor.

SUMMARY

In one embodiment of the disclosure, a vertically oriented nanostructure fabricating method is disclosed. The vertically oriented nanostructure fabricating method includes the following steps. A non-crystalline base is putted on a plate in a vacuum chamber. Many metal catalyst particles are disposed on the non-crystalline base, wherein the diameters of the metal catalyst particles are at least 1 nanometer (nm). The plate is heated to 200-1000 Celsius degrees. A pyrolysis source is applied in the vacuum chamber to be a heat source, and the pyrolysis source is heated to 800-2000 Celsius degrees. Therefore, a thermal field is established in the vacuum chamber via the plate and the pyrolysis source. On the other hand, the pyrolysis source is applied to provide charges and to induct charges on the non-crystalline base. Therefore, an electric field is also established around the non-crystalline base. What is worth to be noticed is that the gradient of the electric filed is disposed orthogonal to the surface of the non-crystalline base. A reaction gas is injected into the vacuum chamber, and the flowing direction of the reaction gas is toward the non-crystalline base so that the gradient of the reaction gas field is disposed parallel to the gradient of the thermal field. And then, many straight nanometer-wires are grown on the surface of the non-crystalline base, and the angle between each of the straight nanometer-wire and the non-crystalline base is 80-90 degrees.

In another embodiment of the disclosure, a vertically oriented nanostructure is disclosed. The vertically oriented nanostructure is made by the method described above. The vertically oriented nanostructure includes a base and many straight nanometer-wires. The straight nanometer-wires are distributed vertically aligned on the base, and the angle between each of the straight nanometer-wire and the base is 80-90 degrees.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
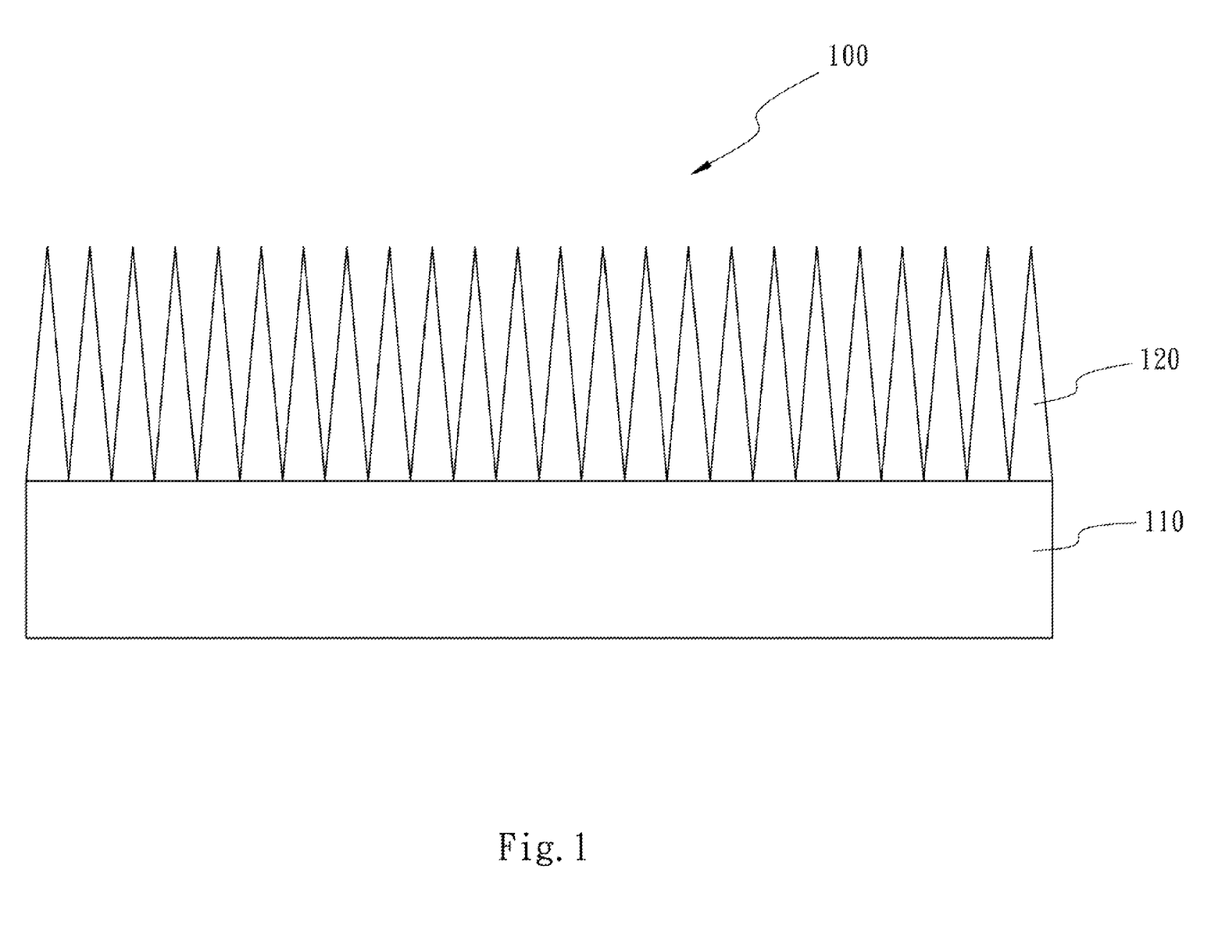
FIG. 1 is a schematic view of the vertically oriented nanostructure being applied as an anti-reflector in one embodiment of the disclosure.

FIG. 1 is a schematic view of the vertically oriented nanostructure being applied as an anti-reflector in one embodiment of the disclosure. The vertically oriented nanostructure 100 includes a non-crystalline base 110 and many nanometer-wires 120. The angle between each of the straight nanometer-wire 120 and the non-crystalline base 110 is 80-90 degrees. The length of the straight nanometer-wire 120 is 100 nm-1000 μm, the diameter of the bottom of the straight nanometer-wire 120 is 10-3000 nm, and the diameter of the top of the nanometer-wire 120 is 1-1000 nm.

The non-crystalline base 110 can be selected from any materials such as the amorphous base, glass, ceramics, synthetic, resin, rubber, metal foil, etc. Therefore, the vertically oriented nanostructure 100 as shown in FIG. 1 can be a good anti-reflector being applied in the surface of many devices. Even the non-crystalline base 110 is twisted, the straight nanometer-wires 120 can still be grown vertically aligned to the direction that is orthogonal to the surface of the non-crystalline base 110.

Figure 2:
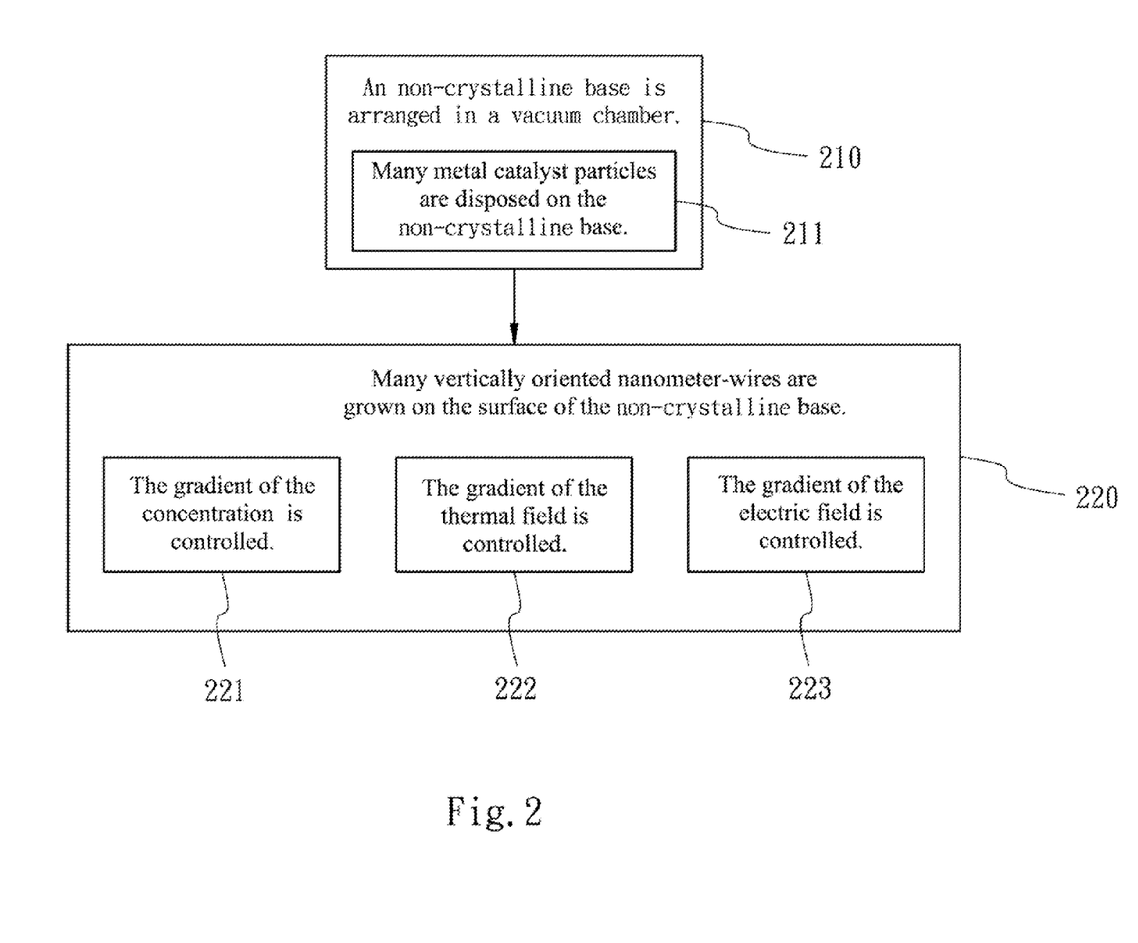
FIG. 2 is a step flow chart illustrating the method of fabricating the anti-reflector in FIG. 1.

FIG. 2 is a step flow chart illustrating the method of fabricating the anti-reflector in FIG. 1. In detail, the method of fabricating the nanostructure 100 includes the following conditions and steps. A traditional vacuum chamber is required. The vacuum chamber can be a hot wall furnace tube, a cold wall stainless steel chamber or a combination of both. In other words, the vacuum chamber is achieved by a cavity such as a thermal chamber, a chemical vapor deposition (CVD) chamber, a furnace tube, a stainless steel or glass cavity. A pyrolysis source is applied in the vacuum chamber to be a cracking source. The pyrolysis source can be achieved by a hot filament, a microwave or a radio frequency plasma providing device. If hot filament is used as the pyrolysis source, it is heated to 800-2000 Celsius degrees. The pyrolysis source is applied to provide three functions, one is to establish a thermal field, another is to crack the reaction gases and the other is to provide charged species. As in shown in step 210 and step 211, the non-crystalline base 110 is arranged inside the vacuum chamber, and many metal catalyst particles are disposed on the non-crystalline base 110 to be a metal catalyst layer. In another viewpoint, the metal catalyst particles disposed on the non-crystalline base 110 can be regard as a thin metal catalyst layer grown on the non-crystalline base 110. The diameters of the metal catalyst particles are at least 1 nm, and the thickness of the metal catalyst layer is 1 nm-1 μm.

The material of the metal catalyst particle is selected from the metals such as Au, Ni, Al, Co, Ga, In, Pd, Fe, Ti, the alloy thereof, the compound thereof and even the combination thereof. The diameter of the metal catalyst particle is 1 nm-1 μm. The way to dispose the metal catalyst particles is unlimited, the plating, the evaporation, the sputtering or even spilling by hand are all acceptable. Furthermore, the nanometer-wires are grown from the metal catalyst particles and thus the density of the metal catalyst layer is controlled based on the requirements of the fabricator. In other words, different areas of the non-crystalline base 110 can be disposed differently to have different densities and thicknesses.

As shown in step 220, many straight nanometer-wires 120 are created on the surface of the non-crystalline base 110. To make the angle between the nanometer-wire 120 and the non-crystalline base 110 be 80-90 degrees, three conditions have to be controlled. First, as shown in step 221, the gradient of the concentration in the vacuum chamber is controlled. Second, as shown in step 222, the gradient of the thermal field in the vacuum chamber is controlled. Third, as shown in step 223, the gradient of the electric field in the vacuum chamber is controlled.

To achieve the conditions in one embodiment, a hot filament is arranged on the top of the vacuum chamber to be a heat source, and the hot filament can be achieved by the tungsten wire, the tantalum wire, the palladium wire, or the platinum wire, etc. The hot filament is not only applied to establish a thermal field but also to establish an electric field. In detail, the temperature of the plate is at least 400 Celsius degrees for silicon and at least 200 Celsius degrees for germanium, and the temperature of the hot filament is at least 800 Celsius degrees for silicon. A thermal field is established and the gradient is disposed from top to bottom. On the other hand, the hot filament provides charges and inducts charges on the non-crystalline base 110, and thus an electric field is established on the surface of the non-crystalline base 110. What is worth to be noticed is that the gradient of the electric filed is disposed orthogonal to the surface of the non-crystalline base 110. As being described above, the hot filament can be replaced by the plasma to be the pyrolysis source.

The reaction gas is injected to the chamber as being taught traditionally. For example, if the silane gas (SiH4) is provided, the silicon (Si) nanometer-wire is created. When the reaction gas is injected into the vacuum chamber, the flowing direction of the reaction gas is toward the non-crystalline base 110, for example, from the top of the chamber, so that the concentration field is also established and the gradient of the concentration field is disposed parallel to the gradient of the thermal field. Meanwhile, the thermal, the electrons, the ions and the radicals are all disposed from top to bottom inside the vacuum chamber. And then, the straight nanometer-wire 120 is created, and the straight nanometer-wire 120 and the non-crystalline base 110 are orthogonal to each other. What is worth to be noticed is that the fabrication method described above can also be applied to create metallic or insulating nanometer-wires.

Figure 3:
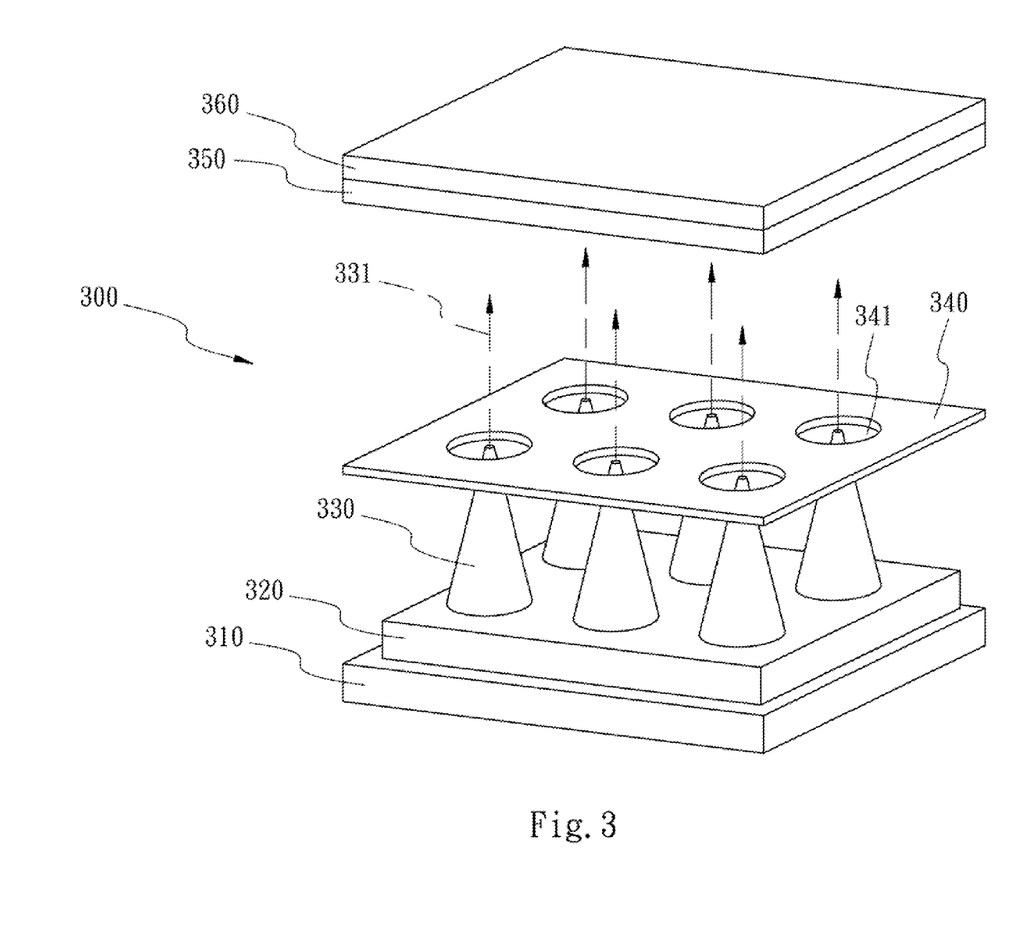
FIG. 3 is a schematic view of the vertically oriented nanostructure being applied as a field emission display in another embodiment of the disclosure.

FIG. 3 is a schematic view of the vertically oriented nanostructure being applied as a field emission display in another embodiment of the disclosure. The field emitter is an important part of the field emission display 300. The field emission display 300 includes a base 310, a cathode conductive layer 320, a filed emitter 330, a mesh gate layer 340, an anode conductive layer 350 and a fluorescent layer 360. The field emitter 330 is achieved by the semiconductor nanometer-wire introduced above, and the field emitter 330 is applied to emit the electrons 331 through the holes 341 of the mesh gate layer 340. As being described above, the semiconductor nanometer-wire can be grown from the surface of the cathode conductive layer 320, and be applied as the field emitter 330.

Figure 4:
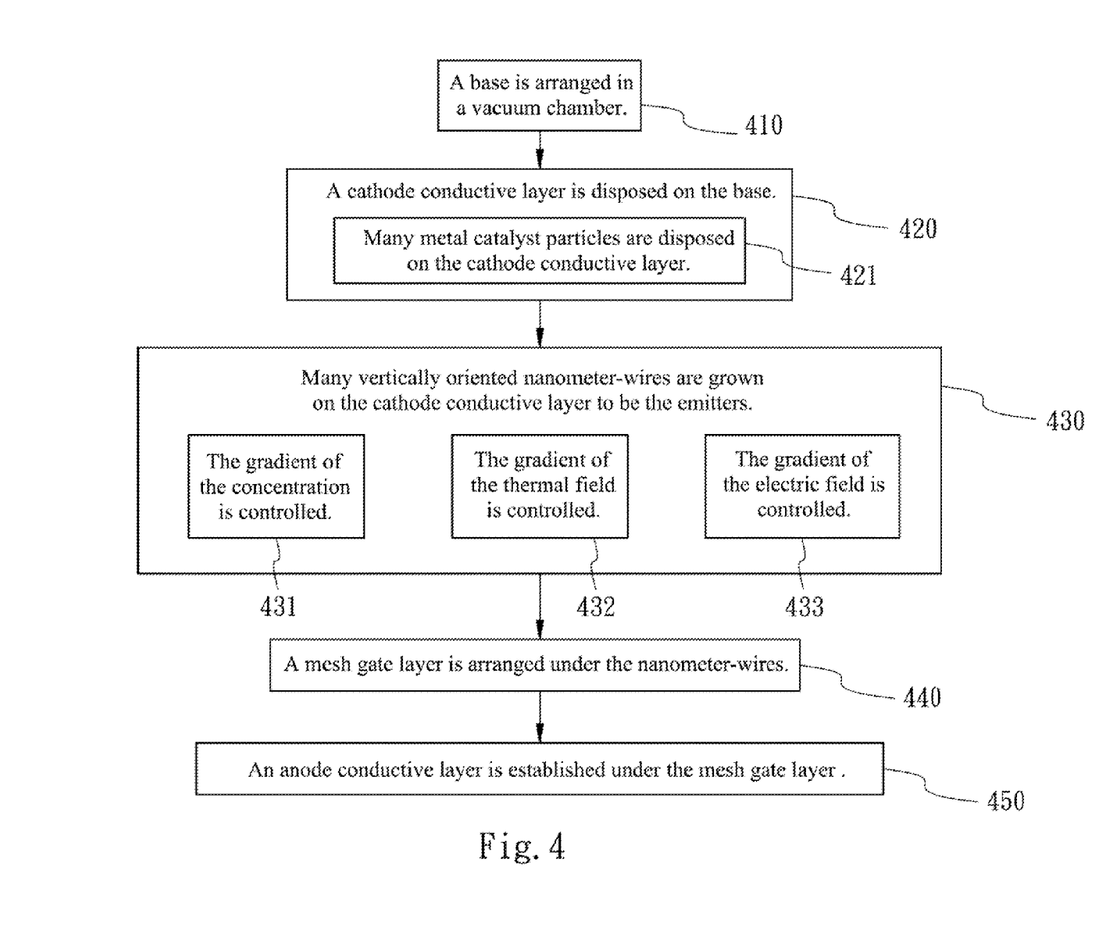
FIG. 4 is a step flow chart illustrating the method of fabricating the field emission display in FIG. 3.

FIG. 4 is a step flow chart illustrating the method of fabricating the field emission display in FIG. 3. The method includes the following steps and conditions. First, as shown in step 410, a base 310 is arranged in a vacuum chamber. Second, as shown in step 420 and step 421, a cathode conductive layer 320 is disposed on the base 310, and many metal catalyst particles are disposed on the cathode conductive layer 320. Third, as shown in step 430, many straight nanometer-wires are grown on the cathode conductive layer 320 to be the emitters 330. As being illustrated in FIG. 2, three conditions are also required as shown in step 431, step 432 and step 433. Fourth, as shown in step 440, a mesh gate layer 340 is arranged under the nanometer-wires 330. Fifth, as shown in step 450, an anode conductive layer 350 is established under the mesh gate layer 340.

Figure 5:
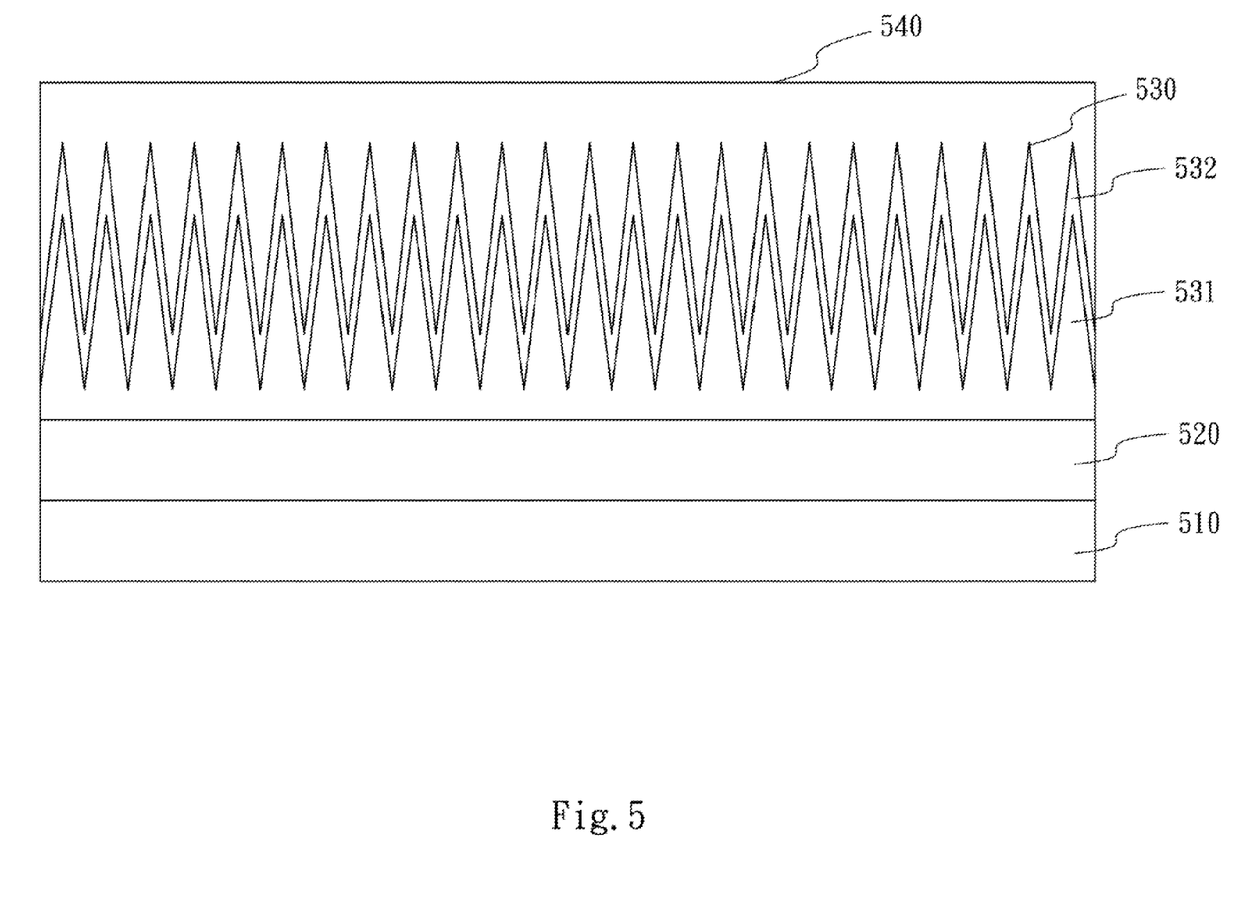
FIG. 5 is a schematic view of the vertically oriented nanostructure being applied as a solar cell in still another embodiment of the disclosure.

FIG. 5 is a schematic view of the vertically oriented nanostructure being applied as a solar cell in still another embodiment of the disclosure. The solar cell includes a base 510, a bottom electrode layer 520, a semiconductor layer 530, and a top electrode layer 540. The semiconductor layer 530 further includes a base semiconductor layer 531 and an emitter semiconductor layer 532. The base semiconductor layer 531 and the emitter semiconductor layer 532 are doped by different ions as being taught traditionally. What is worth to be noticed is that the base semiconductor layer 531 and the emitter semiconductor layer 532 can both be the vertically oriented nanostructures taught by the embodiments described above or vertically oriented base semiconductor nanostructures with emitter semiconductor layer coating.

Figure 6:
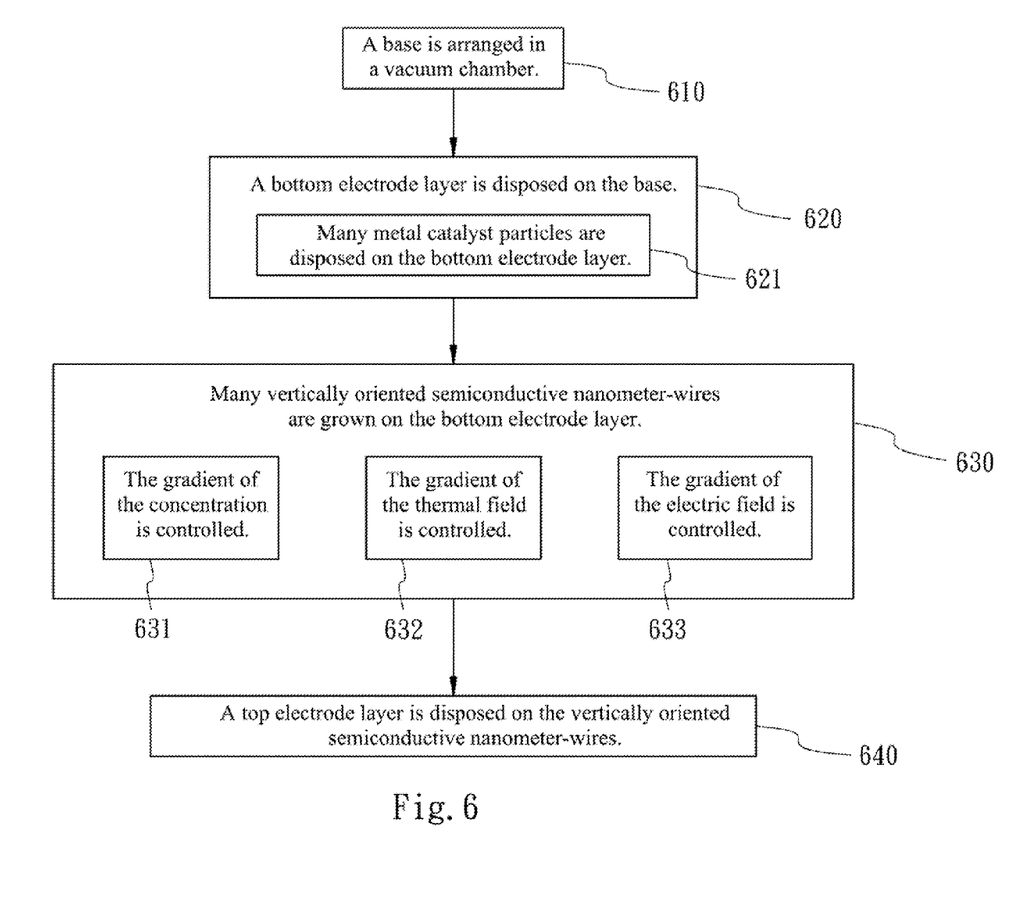
FIG. 6 is a step flow chart illustrating the method of fabricating the solar cell in FIG. 5.

FIG. 6 is a step flow chart illustrating the method of fabricating the solar cell in FIG. 5. The method includes the following steps and conditions. First, as shown in step 610, a base 310 is arranged in a vacuum chamber. Second, as shown in step 620 and step 621, a bottom electrode layer 520 is disposed on the base 510, and many metal catalyst particles are disposed on the bottom electrode layer 520. Third, as shown in step 630, many straight nanometer-wires are grown on the bottom electrode layer 520 to be the semiconductor layer 530. Obviously, two processes are required to fabricate the base semiconductor layer 531 and the emitter semiconductor layer 532 respectively. As being illustrated in FIG. 2, three conditions are also required as shown in step 631, step 632 and step 633. Fourth, as shown in step 640, a top electrode layer 540 is disposed on the semiconductor layer 530.

Figure 7:
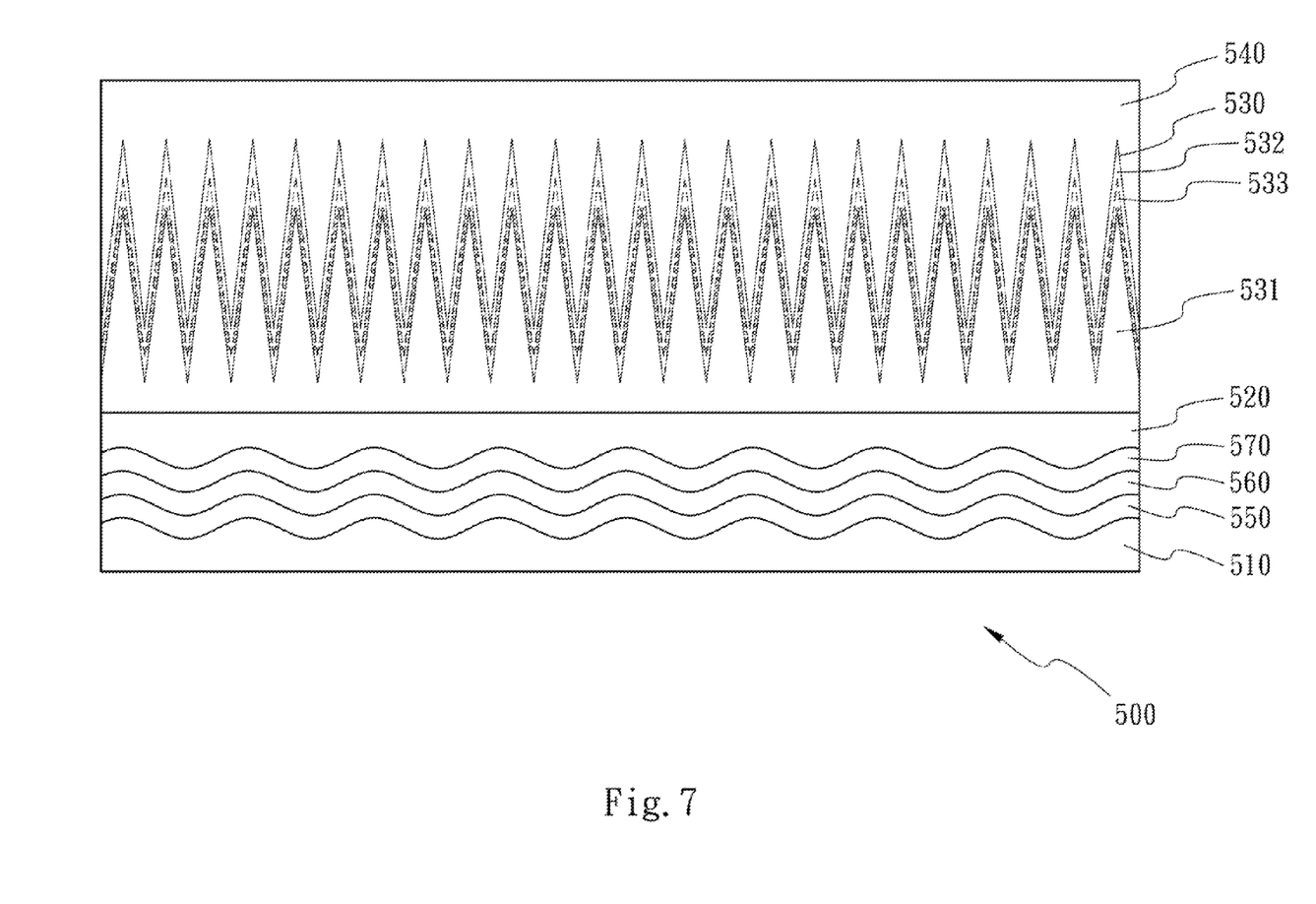
FIG. 7 is a detailed schematic view of FIG. 3.

FIG. 7 is a detailed schematic view of FIG. 3. In FIG. 7, a rough layer 550, an isolating layer 560, and a backside reflecting layer 570 are disposed between the base 510 and the bottom electrode layer 520 in sequence. The semiconductor layer 530 is fabricated by growing the nanometer-wires. The quantum dots layer 533, for example, can be achieved by covering the silicon quantum dots inside the silicon carbide shell. In detail, the proportions of the silicon and the carbon of the reaction gas are controlled, so that the silicon particles are covered inside the silicon carbide shell to be the silicon quantum dots.

Figure 8:
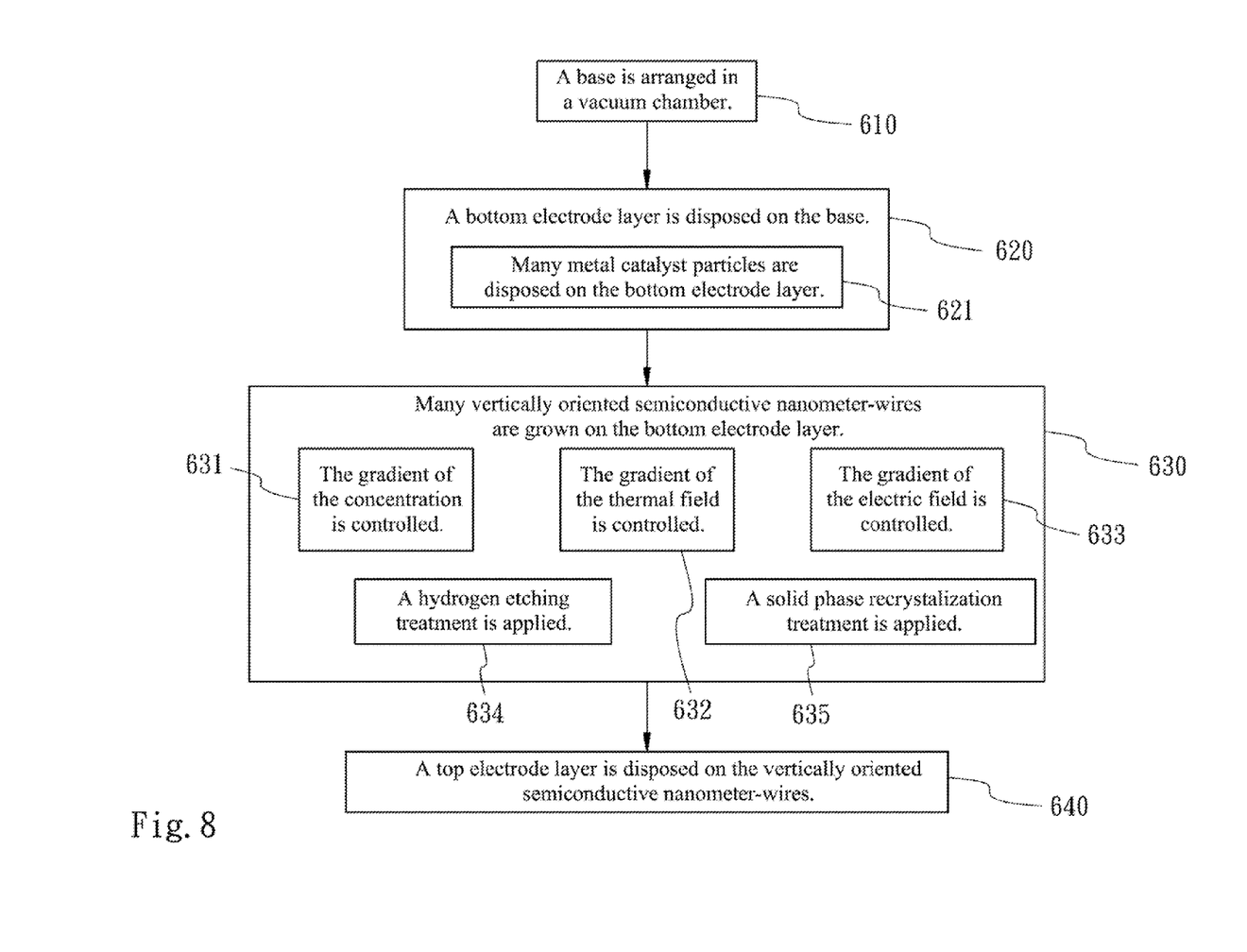
FIG. 8 is a detailed step flow chart of FIG. 6.

FIG. 8 is a detailed step flow chart of FIG. 6. In FIG. 8, there are two further ways that can be applied to modify the outer shape of the nanostructure. The first way is a hydrogen etching treatment as shown in step 634, and the second way is a solid phase recrystallization treatment as shown in step 635. The hydrogen etching treatment means to apply the hydrogen to etch the amorphous phase portion of the straight nanometer-wires. In detail, there are at least two ways to achieve the hydrogen etching. The first one is by using a hydrogen plasma, and the second one is by using a hydrogen radical. The solid phase recrystallization treatment means to solidify the amorphous phase portion of the straight nanometer-wires for recrystallization.

Figure 9A:
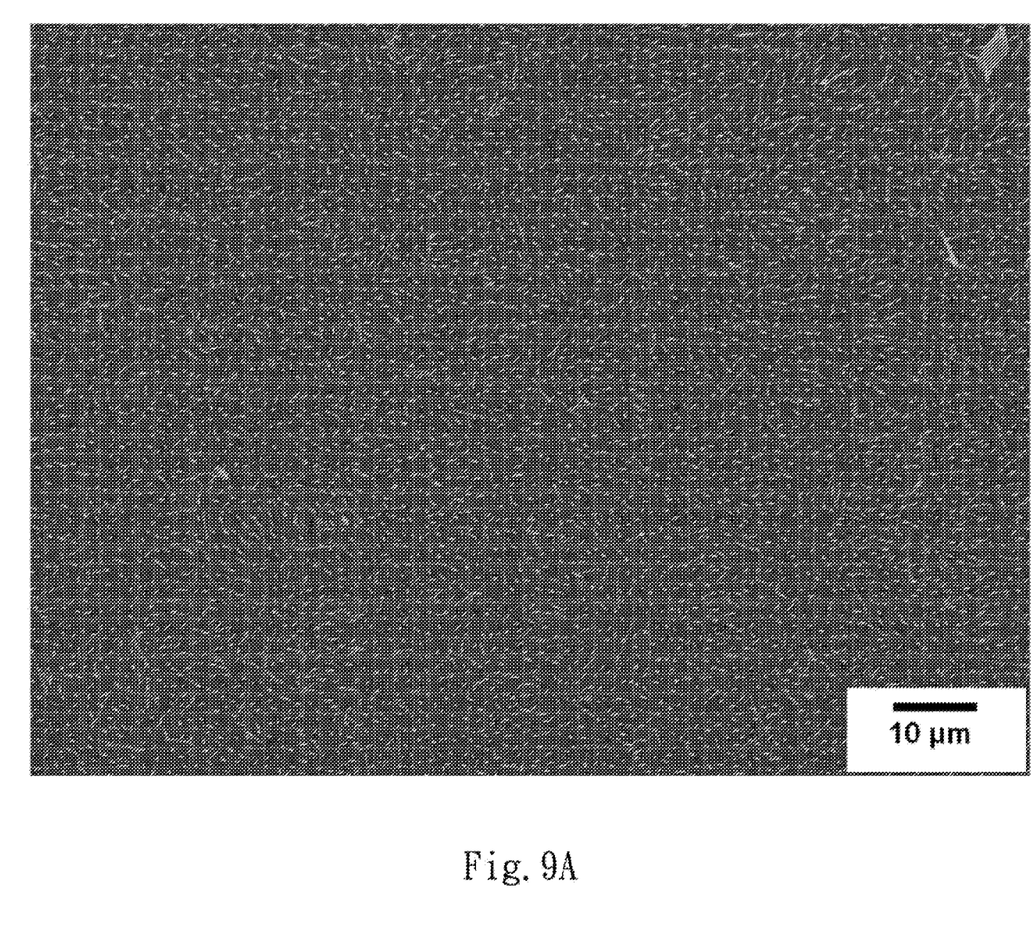
FIG. 9A is a top view of a scanning electron microscope (SEM) image of one example of the disclosure.
Figure 9B:
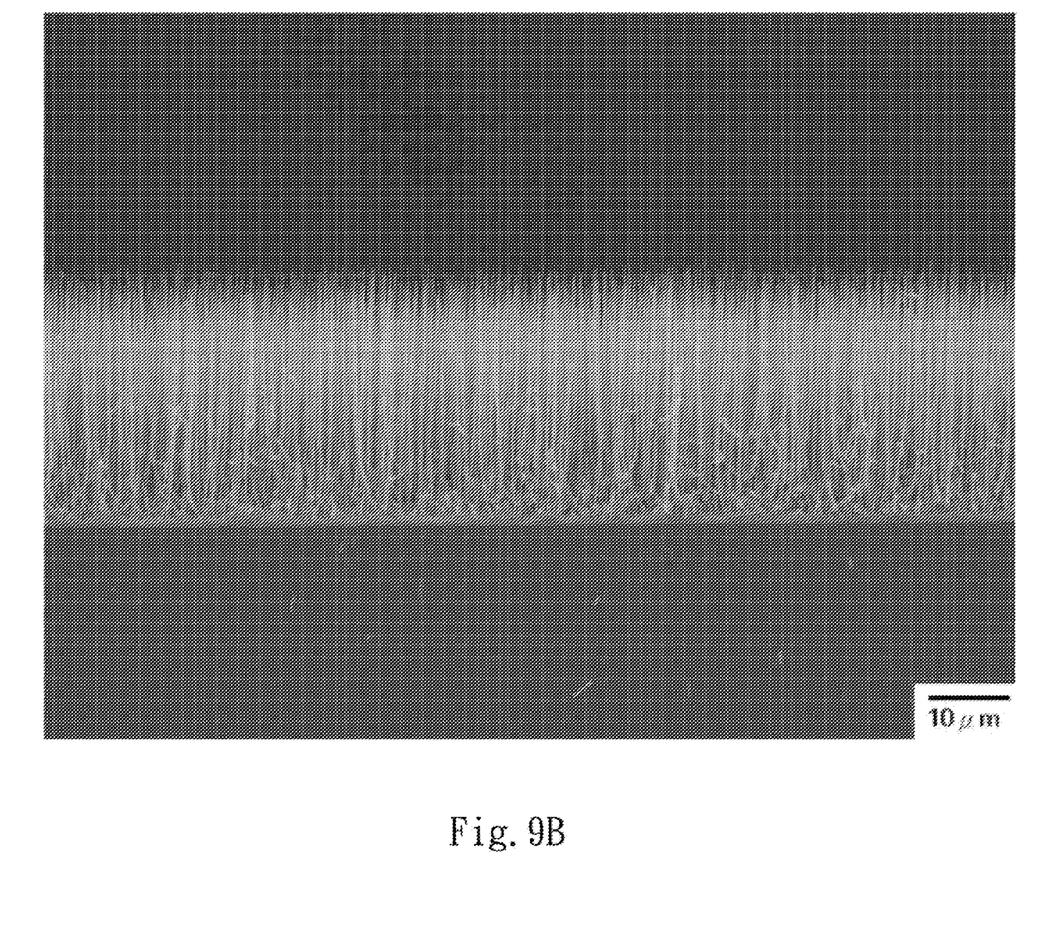
FIG. 9B is a side view of the example in FIG. 9A.
Figure 9C:
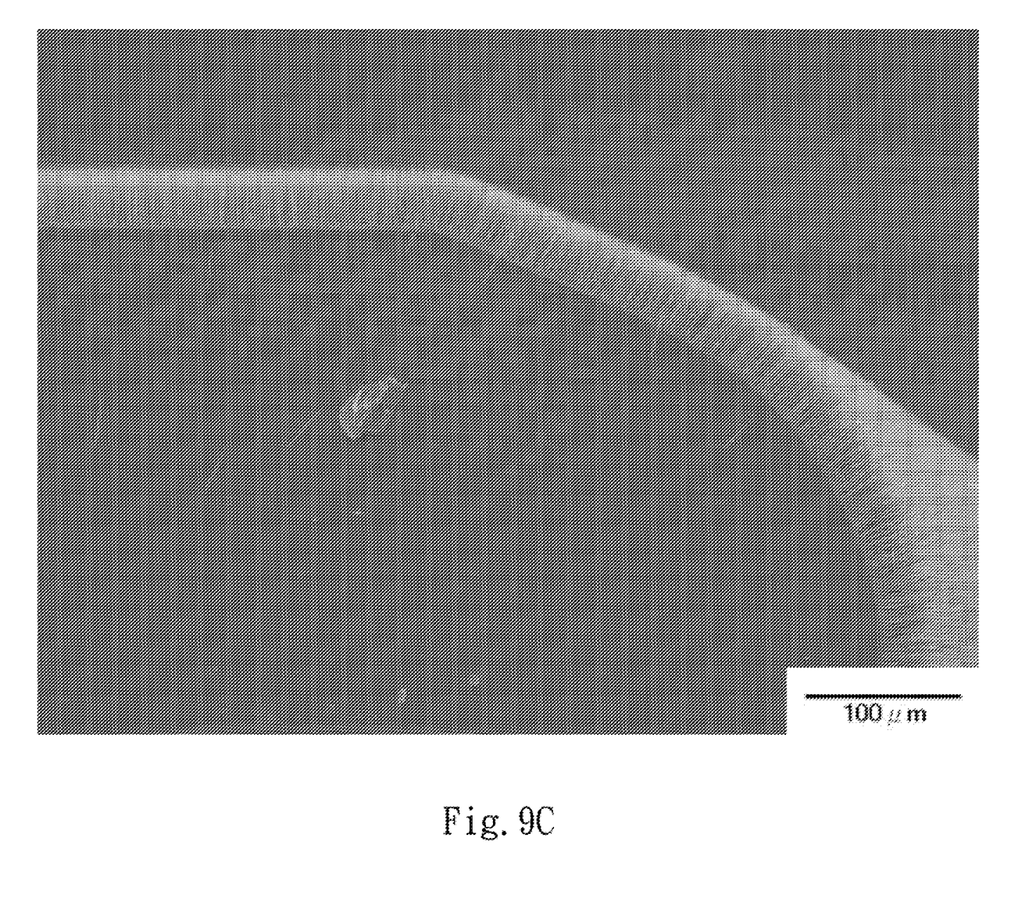
FIG. 9C is a low-magnified cross sectional view of another example.

FIG. 9A is a top view of a scanning electron microscope (SEM) image of one example of the disclosure. FIG. 9B is a side view of the example in FIG. 9A. In FIG. 9A and FIG. 9B, the nanometer-wires are grown straightly from the non-crystalline base without tilting. FIG. 9C is a cross sectional view of another example of the disclosure. It is a SEM image of one sample with curved surface to demonstrate the straight nanometer-wires can still grown vertically aligned to the direction that is orthogonal to the surface of the curved non-crystalline base.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A vertically oriented taper-shaped semiconductor nanostructure fabricating method, comprising the following steps:
   put a non-crystalline on a plate of a vacuum chamber;
   disposing many metal catalyst particles on the non-crystalline base, wherein the diameters of the metal catalyst particles are at least 1 nm;
   heating the plate to 200-1000 Celsius degrees;
   providing a pyrolysis source in the vacuum chamber, and a thermal field is established via the plate and the pyrolysis source in the vacuum chamber;
   using the pyrolysis source to provide charge species, depositing the charge species on the non-crystalline base, and thus establishing an electric field on the surface of the non-crystalline base,
   wherein the gradient of the electric filed is disposed orthogonal to the surface of the non-crystalline base; and
   injecting a reaction gas into the vacuum chamber, wherein the reaction gas is cracked by the pyrolysis source and the flowing direction of the reaction gas is toward the non-crystalline base, so that the gradient of the reaction gas field is disposed parallel to the gradient of the thermal field;
   whereby a plurality of straight and taper-shaped semiconductor nanometer-wires are grown on the surface of the non-crystalline base, and the angle between each of the straight and taper shaped semiconductor nanometer-wires and the non-crystalline base is 80-90 degrees.

2. The vertically oriented taper-shaped semiconductor nanostructure fabricating method of claim 1, wherein the pyrolysis source is a hot filament.

3. The vertically oriented taper-shaped semiconductor nanostructure fabricating method of claim 1, further comprising the step of hydrogen etching an amorphous phase portion of the straight and taper-shaped semiconductor nanometer-wires.

4. The vertically oriented taper-shaped semiconductor nanostructure fabricating method of claim 3, wherein the hydrogen etching step is achieved by applying a hydrogen plasma.

5. The vertically oriented taper-shaped semiconductor nanostructure fabricating method of claim 3, wherein the hydrogen etching step is achieved by applying a hydrogen radical.

6. The vertically oriented taper-shaped semiconductor nanostructure fabricating method of claim 1, further comprising the step of solidifying an amorphous phase portion of the straight and taper-shaped semiconductor nanometer-wires for recrystallization.

7. The vertically oriented taper-shaped semiconductor nanostructure fabricating method of claim 1, wherein the thickness of a metal catalyst layer composed by the metal catalyst particles is 1 nm 1 µm.

8. The vertically oriented taper-shaped semiconductor nanostructure fabricating method of claim 1, wherein the metal catalyst particles are selected from the group of Au, Ni, Al, Co, Ga, In, Pd, Fe, Ti, alloy thereof, compound thereof and combination thereof.

9. The vertically oriented taper-shaped semiconductor nanostructure fabricating method of claim 1, wherein the vacuum chamber is a hot wall furnace tube.

10. The vertically oriented taper-shaped semiconductors nanostructure fabricating method of claim 1, wherein the vacuum chamber is a cold wall stainless steel chamber.

11. A vertically oriented semiconductor-based nanostructure fabricating method, comprising the following steps:
    putting a non-crystalline base on a plate of a vacuum chamber;
    disposing many metal catalyst particles on the non-crystalline base, wherein the diameters of the metal catalyst particles are at least 1 nm;
    providing a pyrolysis source on a top of the vacuum chamber;
    generating a thermal field in the vacuum chamber and controlling a gradient of the thermal field from the top to a bottom of the vacuum chamber, comprising:
      heating the pyrolysis source; and
      heating the plate of the vacuum chamber to 200-1000 Celsius degrees;
    generating an electric field in the vacuum chamber and controlling a gradient of the electric field so that the electrical field is orthogonal to the surface of the non-crystalline base, comprising:
      providing charge species using the pyrolysis source, and
    depositing charges on the non-crystalline base; and
    generating a concentration field of reaction gas and controlling a gradient of the concentration field so that the gradient of concentration field is disposed parallel to the gradient of the thermal field, comprising:
      injecting a reaction gas into the vacuum chamber, wherein the flowing direction of the reaction gas is toward the non-crystalline base;
    whereby a plurality of straight nanometer-wires are grown on the surface of the non-crystalline base, and the angle between each of the straight nanometer-wires and the non-crystalline base is 80-90 degrees.

12. The vertically oriented semiconductor-based nanostructure fabricating method of claim 11, wherein the pyrolysis source is a hot filament.

13. The vertically oriented semiconductor-based nanostructure fabricating method of claim 11, further comprising the step of hydrogen etching an amorphous phase portion of the straight nanometer-wires.

14. The vertically oriented semiconductor-based nanostructure fabricating method of claim 13, wherein the hydrogen etching step is achieved by applying a hydrogen plasma.

15. The vertically oriented semiconductor-based nanostructure fabricating method of claim 13, wherein the hydrogen etching step is achieved by applying a hydrogen radical.

16. The vertically oriented semiconductor-based nanostructure fabricating method of claim 11, further comprising the step of solidifying an amorphous phase portion of the straight nanometer-wires for recrystallization.

17. The vertically oriented semiconductor-based nanostructure fabricating method of claim 11, wherein the thickness of a metal catalyst layer composed by the metal catalyst particles is 1 nm-1 μm.

18. The vertically oriented semiconductor-based nanostructure fabricating method of claim 11, wherein the metal catalyst particles are selected from the group of Au, Ni, Al, Co, Ga, In, Pd, Fe, Ti, alloy thereof, compound thereof and combination thereof.

* * * * *